(12) United States Patent
Peter et al.

(10) Patent No.: US 7,791,081 B2
(45) Date of Patent: Sep. 7, 2010

(54) RADIATION-EMITTING SEMICONDUCTOR CHIP

(75) Inventors: Matthias Peter, Alteglofsheim (DE);
Uwe Strausse, Bad Abbach (DE);
Matthias Sabathil, Regensburg (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 970 days.

(21) Appl. No.: 11/494,984

(22) Filed: Jul. 28, 2006

(65) Prior Publication Data
US 2010/0181583 A1    Jul. 22, 2010

(30) Foreign Application Priority Data
Jul. 29, 2005 (DE) .................. 10 2005 035 721
Oct. 7, 2005 (DE) .................. 10 2005 048 196

(51) Int. Cl.
*H01L 27/15* (2006.01)
(52) U.S. Cl. .................. 257/79; 257/103; 257/86
(58) Field of Classification Search .................. 257/79, 257/86, 87, 103
See application file for complete search history.

(56) References Cited

U.S. PATENT DOCUMENTS 5,889,295 A * 3/1999 Rennie et al. .................. 257/96
6,667,498 B2 * 12/2003 Makimoto et al. .......... 257/183
6,987,287 B2    1/2006 Liu et al.
2004/0222431 A1  11/2004 Flynn et al.

FOREIGN PATENT DOCUMENTS

| DE | 103 29 884 A1 | 3/2004 |
|---|---|---|
| EP | 0 890 997 A2 | 7/1998 |
| EP | 1 536 486 A1 | 7/2003 |
| GB | 2 407 701 A | 5/2005 |
| WO | WO 2004/102153 A2 | 5/2004 |

OTHER PUBLICATIONS

I. Schnitzer, et al., "30% external quantum efficiency from surface textured, thin-film light-emitting diodes", Appl. Phys. Lett., vol. 63, No. 16, pp. 2174-2176, Oct. 18, 1993.
P. Bhattacharya et al., "Tunneling Injection Lasers: A New Class of Lasers with Reduced Hot Carrier Effects", IEEE Journal of Quantum Electronics, vol. 32, No. 9, pp. 1620-1628, Sep. 1996.
W. Harth et al., "Sende- und Empfangsdioden für die Optische Nachrichtentechnik," B.G. Teubner, Stuttgart 1984; ISBN:3-519-00102-0, pp. 23-25. (English Abstract included).

* cited by examiner

*Primary Examiner*—Leonardo Andujar
(74) *Attorney, Agent, or Firm*—Cohen Pontani Lieberman & Pavane LLP

(57) ABSTRACT

A radiation-emitting semiconductor chip is specified, comprising a semiconductor body (3) having an n-conducting region (4) and a p-conducting region (5), the semiconductor body having a hole barrier layer containing a material from the material system $In_yGa_{1-x-y}Al_xN$.

32 Claims, 5 Drawing Sheets

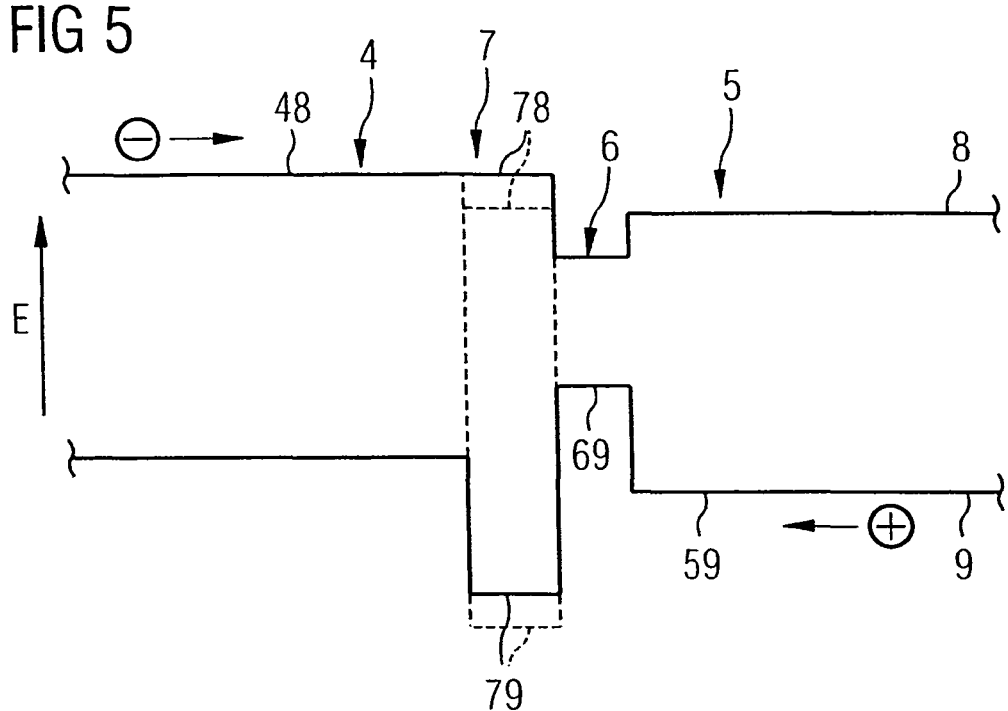
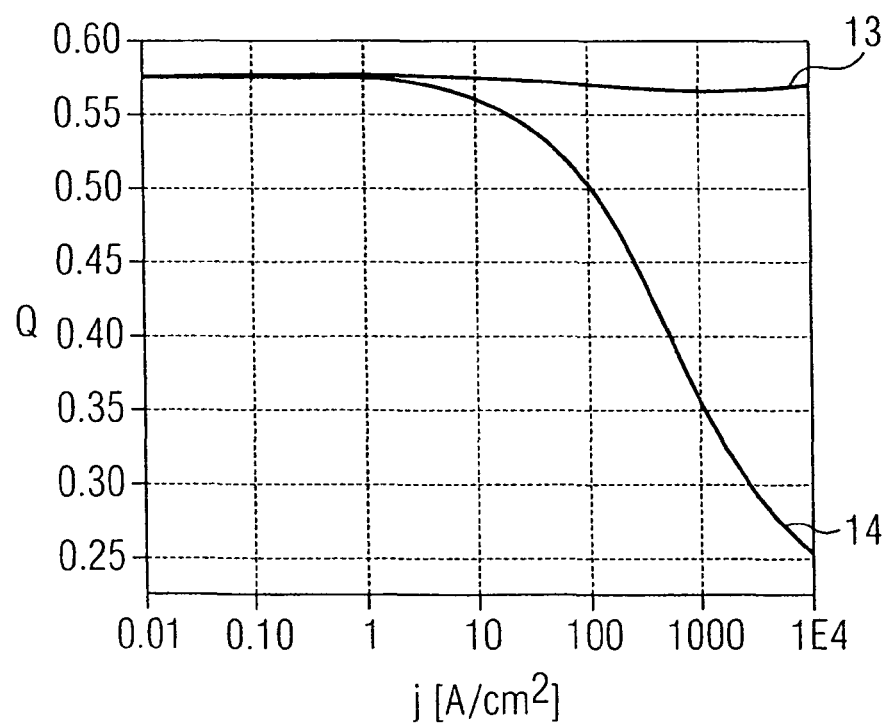

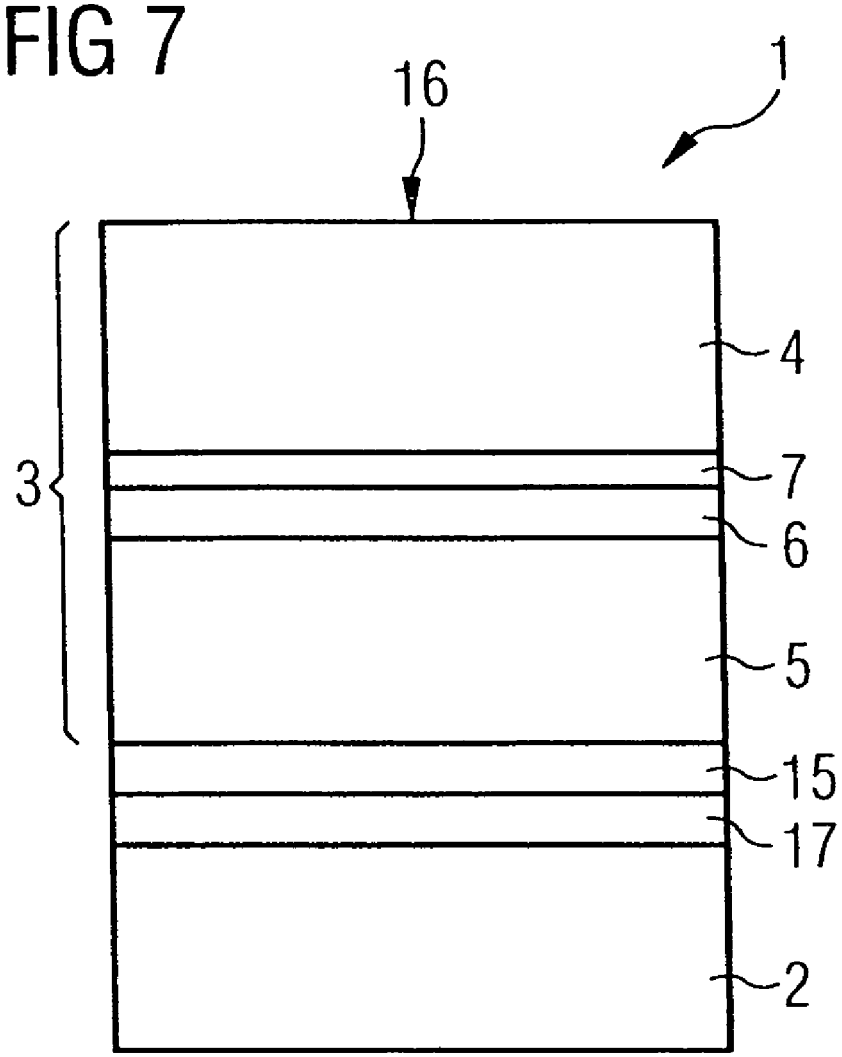

RADIATION-EMITTING SEMICONDUCTOR CHIP

RELATED APPLICATIONS

This patent application claims the priority of German patent applications 10 2005 035 721.0 filed Jul. 29, 2005 and 10 2005 048 196.5 filed Oct. 7, 2005, the disclosure content of which is hereby incorporated by reference

FIELD OF THE INVENTION

The present invention relates to a radiation-emitting semiconductor chip having an active region suitable for generating radiation.

BACKGROUND OF THE INVENTION

The internal quantum efficiency of semiconductor chips when generating radiation, in particular those which are based on nitride compound semiconductor materials, often depends crucially on the operating current density with which the semiconductor chip is operated. Here, the expression "internal quantum efficiency" is understood to mean the ratio of the number of charge carriers of one type—electrons or holes—that are injected into the active region to the number of photons generated therefrom in the active region.

The greater the operating current density, particularly in the case of nitride-based semiconductor chips, the lower is the internal quantum efficiency. More efficient operation of semiconductor chips at high current densities would make it easier to generate an increased radiation power cost-effectively, without enlarging the active area, i.e. the area of the active region of the chip, with this semiconductor chip.

SUMMARY OF THE INVENTION

It is an object of the present invention to provide a semiconductor chip which can be formed in a simplified manner with a reduced dependence of the internal quantum efficiency on the operating current density.

This and other objects are attained in accordance with one aspect of the present invention directed to a radiation-emitting semiconductor chip that comprises a semiconductor body, which has an n-conducting region and a p-conducting region, an active region suitable for generating radiation being arranged between the n-conducting region and the p-conducting region, in which active region electrons passed into the active region via the n-conducting region and holes passed into the active region via the p-conducting region recombine with generation of radiation. A hole barrier layer is arranged on an opposite side of the active region of the semiconductor chip from the p-conducting region, said hole barrier layer containing a material from the III-V semiconductor material system $In_yGa_{1-x-y}Al_xN$ where $0 \leq x \leq 1$, $0 \leq y \leq 1$, and $x+y \leq 1$, the hole barrier layer being transmissive for electrons.

The hole barrier layer is preferably arranged in the semiconductor body and formed in such a way that it reduces or completely blocks penetration of holes into the n-conducting region.

The hole barrier layer thus impedes the penetration of holes to the n-conducting region and thus reduces the probability of holes recombining with electrons non-radiatively in the n-conducting region. The probability of holes recombining radiatively in the active region is correspondingly increased since, by means of the hole barrier layer, the holes are kept to an increased extent on that side of the hole barrier layer which faces the active region. In particular, even for high current densities holes can in this way be kept to an increased extent on that side of the hole barrier layer which faces the active region. The internal quantum efficiency can accordingly be advantageously increased by means of the hole barrier layer. The dependence of the internal quantum efficiency on the operating current density is advantageously reduced by means of the hole barrier layer. This is manifested to a particular degree at comparatively high current densities since the probability of holes entering in the n-conducting regions generally increases greatly and nonlinearly as the operating current density increases.

The hole barrier layer is preferably formed in such a way that the probability of passage of electrons through the hole barrier layer is greater than the probability of passage of the holes through the hole barrier layer. For this purpose, a barrier for the passage of electrons through the hole barrier layer is preferably smaller than a barrier for the passage of holes through the hole barrier layer.

This may be achieved by forming the hole barrier layer in a suitable manner. By way of example a potential barrier for the hole is formed by means of the hole barrier layer. The higher the said potential barrier, the lower generally is the probability of passage of the holes. Furthermore, the probability of passage generally also decreases as the thickness of the hole barrier layer increases. The potential barrier may be set by means of a band gap of the hole barrier layer. If appropriate the potential barrier for the holes may be increased by suitable doping in particular by suitable n-conducting doping, particularly preferably the potential barrier for electrons being simultaneously reduced.

The ratio of the probability of passage of the holes through the hole barrier layer to that of the electrons may be for example 1/10 or less, preferably 1/100 or less, particularly preferably 1/1000 or less. The smaller said ratio, the lower the risk of the hole barrier layer reducing, by a blockage of the electrons, the internal quantum efficiency on account of the then reduced number of electrons reaching the active region.

The hole barrier layer is preferably arranged between the n-conducting region and the active region. The penetration of holes into the n-conducting region can be reduced particularly effectively by means of such an arrangement. The hole barrier layer may be embodied in intrinsic fashion, i.e., in undoped fashion. A undoped layer can be fabricated in a simplified manner, if appropriate, relative to a doped layer. As an alternative, however, the hole barrier layer may also be embodied in doped fashion, in particular doped in n-conducting fashion. The hole barrier layer is then expediently integrated in the n-conducting region.

An arrangement of the hole barrier layer on a side of the n-conducting region that faces the active region in the n-conducting region is furthermore particularly expedient for a hole barrier. The n-conducting region is preferably delimited by the hole barrier layer on the part of the active region.

Furthermore, the hole barrier layer preferably adjoins the active region or the hole barrier layer delimits the active region. In the latter case, the hole barrier layer may for example simultaneously serve as a confinement layer for the active region, by means of which charge carriers can be confined in the active region. An arrangement of the hole barrier layer as close as possible to the active region is particularly advantageous for a hole barrier layer.

In one preferred configuration, the aluminum content x in the hole barrier layer is greater than 0. The band gap of the hole barrier layer can be set by means of the aluminum content and the height of the resulting potential barrier for the holes can be determined in this way. The greater the aluminum content the larger generally is the band gap of the hole barrier layer. The barrier height generally also increases with the band gap.

The aluminum content x is preferably greater than or equal to 0.2, particularly preferably greater than or equal to 0.5, for example up to 1. Aluminum contents of this type make it possible to achieve an efficient hole blockade by means of the hole barrier layer, in particular in a semiconductor body based on nitride compound semiconductors.

As the aluminum content increases, however, generally the lattice constant of the hole barrier layer also decreases. This holds true in particular for an indium-free hole barrier layer where y=0. This may result in tensile strain in the semiconductor body. Such strain in the semiconductor body, in particular in the active region, may in turn lead to a reduction of the internal quantum efficiency of the semiconductor chip. This holds true in particular for an active region which contains a layer made from the III-V semiconductor material system $In_yGa_{1-y}N$ where $0<y\leq1$ or is based on said material system. A layer made from said material system is free of aluminum. The lattice mismatch of such a layer with respect to an aluminum-containing layer may therefore lead to an increased extent to strain in the semiconductor body, in particular in the active region. In order to keep the strain in the semiconductor body resulting from the hole barrier layer tolerably small, x is preferably less than or equal to 0.45. This is of particular importance if the hole barrier layer is formed in a manner free of indium where y=0.

If the hole barrier layer is formed such that it contains indium, i.e. where y is greater than 0, then the lattice constant and the band gap of the hole barrier layer can advantageously be set essentially independently of one another by variation of the indium content y and the aluminum content x.

The hole barrier layer may thus be formed as a buffer layer. By means of the buffer layer, it is possible during the production of the semiconductor body, for example by means of epitaxial growth, to optimize the lattice constant for further semiconductor layers to be applied to the buffer layer. Strains can thus be reduced. The hole barrier layer is preferably formed as a buffer layer for the layer(s) for the active region. A reduction of the efficiency of the active region, in particular of an InGaN-based active region, can thus be prevented. Here, it is preferred that $0<y<x$, in particular $0\leq y\leq x\leq 1$. The tensile strain that occurs in a simplified fashion on account of the comparatively high aluminum content x can advantageously already be sufficiently counteracted by an indium content y smaller than the aluminum content x. The strain is preferably completely avoided. However, an indium-free hole barrier layer containing aluminum can be produced in simplified fashion relative to a hole barrier layer containing indium and aluminum.

In a further preferred configuration, the hole barrier layer is embodied as a tunnel barrier layer, the tunnel barrier layer being formed in such a way that electrons tunnel through it with a higher probability than holes. By means of the tunnel barrier layer, a potential barrier is formed both for the electrons and for holes, the respective potential barrier having to be overcome by electrons before penetrating into the active region and by holes before penetrating into the n-conducting region.

The energy of the conduction band edge of the tunnel barrier layer is preferably greater than the energy of the conduction band edge of a layer that adjoins the tunnel barrier layer on the part of the n-conducting region. The difference between these energies determines the maximum barrier height of the potential barrier that is to be overcome by the electrons before penetrating into the active region.

The energy of the valence band edge of the tunnel barrier layer is preferably less than the energy of the valence band edge of a layer which is arranged on a side of the tunnel barrier layer which is opposite to the n-conducting region and, in particular, adjoins the tunnel barrier layer, for example a layer of the active region. The difference between these energies determines the maximum barrier height of the potential barrier that is to be overcome by the holes before penetrating into the n-conducting region.

A band gap of the tunnel barrier layer is furthermore preferably larger than the band gap of a layer that adjoins the tunnel barrier layer on the part of the n-conducting region and/or a layer that adjoins the tunnel barrier layer on the side which is opposite to the n-conducting region in the semiconductor body. This facilitates the formation of a barrier for electrons and holes.

The tunneling probability depends on the barrier height and on the barrier thickness. The thicker the tunnel barrier layer or the higher the potential barrier, the lower generally is the tunneling probability. The tunneling probability is furthermore determined by the effective mass of the charge carriers, the tunneling probability generally decreasing as the effective mass increases. Since the holes regularly have an effective mass greater than that of the electrons the tunneling probability of the holes is often lower than that of the electrons.

The tunnel barrier layer preferably has a thickness of 8 nm or less, particularly preferably of 4 nm or less. Furthermore, it is preferably the case that $0.2\leq x\leq 0.45$. By means of such tunnel barrier layers, it is possible to form a tunnel barrier which efficiently reduces penetration of holes into the n-conducting region and only moderately impedes the passage of electrons from the n-conducting region into the active region. Furthermore, strain in the semiconductor body can be kept comparatively low by choosing the aluminum content in the range mentioned above. The aluminum content for a tunnel barrier layer is particularly preferably greater than or equal to 0.3.

The tunnel barrier layer may be doped in n-conducting fashion or be embodied in intrinsic fashion. The barrier height for electrons can be lowered by n-conducting doping, for example by means of Si. On account of the band gap that essentially remains constant in the case of the doping, the barrier for the holes is simultaneously increased by this means. An undoped layer can be produced in a simplified manner relative to a doped layer. Furthermore, it is possible to incorporate defects into the tunnel barrier layer, which assist the tunneling of the electrons and increase the tunneling probability of the electrons relative to that of the holes. By way of example, Si is suitable as a defect atom.

In a further preferred configuration, the hole barrier layer is formed as a pure hole barrier layer which blocks, in particular completely, holes from passing through. Preferably, the pure hole barrier layer is essentially completely transmissive for the electrons. The pure hole barrier layer furthermore preferably forms a potential barrier for the holes, while in contrast to a tunnel barrier layer the electrons pass through the pure hole barrier layer essentially in a manner free of a potential barrier. On account of the unimpeded passage of the electrons through the pure hole barrier layer, the internal quantum efficiency of the semiconductor chip can be increased compared with a tunnel barrier layer.

Preferably, the pure hole barrier layer is doped in n-conducting fashion in such a way that the energy of the conduction band edge of the hole barrier layer is less than or equal to the energy of the conduction band edge of a layer adjoining the pure hole barrier layer on the side of the pure hole barrier layer which is opposite to the active region. By way of example, Si is suitable as donor.

The pure hole barrier layer may have, in particular, such a high potential barrier and/or thickness that if an electron barrier were also formed by means of the hole barrier layer, electrons would not penetrate through said barrier or would penetrate through it only with the probability of $10^{-5}$ or less. For a completely transmissive layer, the passage probability would be equal to 1.

The pure hole barrier layer preferably has a thickness of 11 nm or more. Furthermore, the pure hole barrier layer preferably has a thickness of 30 nm or less. A pure hole barrier layer having a thickness of this type has proved to be particularly suitable for efficiently blockading the penetration of the holes into the n-conducting region. The hole barrier layer may, of course, also be embodied with a thickness of more than 30 nm, the barrier effect not being considerably intensified by increasing said thickness.

Furthermore, an aluminum content 0.2×0.3 has proved to be particularly expedient for a pure hole barrier layer.

In a further preferred configuration, the semiconductor body is arranged on a carrier. The semiconductor chip then comprises the carrier with the semiconductor body arranged thereon. The carrier can mechanically stabilize the semiconductor body, which preferably has a semiconductor layer sequence having a plurality of semiconductor layers.

By way of example, the carrier may be formed from an epitaxial substrate on which the semiconductor body is grown epitaxially. However, the carrier may also be different from the epitaxial substrate. If the carrier is different from the epitaxial substrate, then the semiconductor chip is also referred to as a thin-film chip. For thin-film chips, the semiconductor body is preferably firstly grown on the epitaxial substrate. Afterward, the semiconductor body, preferably on the side remote from the epitaxial substrate, is arranged and preferably fixed on the carrier. The epitaxial substrate is thereupon removed, for example by etching or a laser separating method. Mechanical support of the semiconductor body is ensured by the carrier.

In the case of thin-film chips, the hole barrier layer is preferably arranged on the side of the active region which is opposite to the carrier while the hole barrier layer, in the case of non-thin-film chips, is preferably arranged between the active region and the carrier. Such an arrangement is produced in particular when first the n-conducting region of the semiconductor body is grown on the epitaxial substrate. The p-conducting region is then arranged on that side of the active region which is remote from the epitaxial substrate, and is accordingly arranged on the side of the carrier during the formation of a thin-film chip, so that the active region is arranged between the hole barrier layer and the carrier.

For thin-film chips, the carrier may be chosen comparatively freely when compared to an epitaxial substrate, since the requirements made of a carrier for a thin-film chip are generally less stringent than those to which an epitaxial substrate is subject, for instance with regard to the crystal structure thereof. The carrier may be chosen for example with regard to optimized thermal and/or electrical conductivity.

A thin-film chip, in particular a thin-film light-emitting diode chip, may furthermore be distinguished by at least one of the following characteristic features:

a reflective layer is applied or formed at a main area—facing the carrier—of the semiconductor body, which preferably has an epitaxial layer sequence, said reflective layer reflecting at least part of the electromagnetic radiation generated in the semiconductor body back into the latter, the semiconductor body, in particular the epitaxial layer sequence, has a thickness in the region of 20 µm or less, in particular in the region of 10 µm, and/or the semiconductor body, in particular the epitaxial layer sequence contains at least one semiconductor layer with at least one area which has an intermixing structure which ideally leads to an approximately ergodic distribution of the light in the semiconductor body, in particular in the epitaxial layer sequence, i.e. the intermixing structure has an as far as possible ergodically stochastic scattering behavior.

A basic principle of a thin-film light-emitting diode chip is described for example in I. Schnitzer et al., Appl. Phys. Lett. 63 (16), Oct. 18, 1993, 2174-2176, the disclosure content of which is in this respect hereby incorporated by reference.

A mirror layer is preferably arranged between the carrier and the active region, particularly preferably between the semiconductor body and the carrier. The mirror layer can reflect radiation generated in the active region and thus reduce an absorption of radiation in structures, such as the carrier, for instance, arranged on the side of the mirror layer which is opposite to the active region. The mirror layer is particularly preferably embodied as a metallic mirror layer. A metal-containing mirror layer is distinguished by a reflectivity that generally has an advantageously low directional dependence. Furthermore, the mirror layer is preferably embodied in electrically conductive fashion and is particularly preferably electrically conductively connected to the active region. Electrical contact can thus be made with the chip via the mirror layer and, if appropriate, via an electrically conductive carrier.

BRIEF DESCRIPTION OF THE DRAWINGS

FIG. 5 schematically shows the profile of the valence and conduction band edge for a pure hole barrier layer;

FIG. 6 shows a diagram depicting the dependence of the internal quantum efficiency of the semiconductor chip on the operating current density for a semiconductor chip with a hole barrier layer and a semiconductor chip without a hole barrier layer; and FIG. 7 shows a schematic sectional view of a second exemplary embodiment of a radiation-emitting semiconductor chip according to the invention.

DETAILED DESCRIPTION OF THE DRAWINGS

Identical elements, elements of identical type and identically acting elements are provided with identical reference symbols in the Figures.

Figure 1:
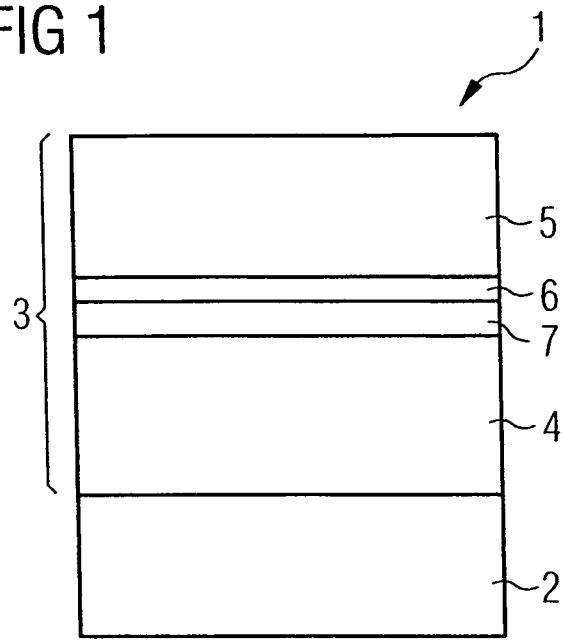
FIG. 1 shows a schematic sectional view of a first exemplary embodiment of a radiation-emitting semiconductor chip according to the invention.

FIG. 1 shows a schematic sectional view of a first exemplary embodiment of a radiation-emitting semiconductor chip according to the invention.

The semiconductor chip 1 which is preferably embodied as an LED chip, comprises a semiconductor body 3 arranged on a carrier 2. The semiconductor body has an n-conducting region 4 and a p-conducting region 5, between which is arranged an active region 6 suitable for generating radiation. The n-conducting and/or the p-conducting region may have a plurality of semiconductor layers (not illustrated). A hole barrier layer 7 is formed between the n-conducting region 4 and the active region 6 or in a manner integrated in the n-conducting region. The hole barrier layer 7 preferably adjoins the active region 6 or delimits the latter. The hole barrier layer 7 is based on a nitride compound semiconductor material from the material system $In_yGa_{1-x-y}Al_xN$ where $0 \leq x \leq 1$, $0 \leq y \leq 1$, and $x+y \leq 1$ and is formed in such a way that it reduces or completely blocks penetration of the holes that are passed into the active zone via the p-conducting region 5 during operation of the semiconductor chip 1. The hole barrier layer 7 is embodied such that it is transmissive for electrons that are passed to the active region 6 via the n-conducting region 4. Electron-hole pairs can recombine in the active region with generation of radiation.

The semiconductor body 3 is preferably grown epitaxially on an epitaxial substrate. The carrier 2 may, in particular, be derived from the epitaxial substrate on which a semiconductor layer sequence for the semiconductor body is grown. For example, the carrier may be a small piece of the expitaxial substrate formed from the large area of the substrate during singulation of individual chips out of the wafer. The semiconductor body is furthermore preferably based on nitride compound semiconductor materials. An SiC substrate or a sapphire substrate is particularly suitable as an epitaxial substrate in this case.

The semiconductor chip is preferably formed for generating ultraviolet or visible radiation, in particular from the blue to the green spectral range. Nitride compound semiconductors are particularly suitable for generating radiation in the aforementioned spectral ranges.

The active region 6 is expediently formed in such a way that barriers are formed on both sides around the active region 6 both for the electrons in the conduction band and for the holes in the valence band and confine charge carriers in the active region. The internal quantum efficiency of the semiconductor chip can be increased in this way. One of said barriers is preferably formed by the hole barrier layer, which may accordingly also be formed as a confinement layer.

In one preferred configuration, the active region 6 comprises a single or multiple quantum well structure. Structures of this type are particularly suitable for forming an active region having a high internal quantum efficiency.

In the context of the application, the designation "quantum well structure" encompasses any structure in which charge carriers experience quantization of their energy states as a result of confinement. In particular, the designation quantum well structure comprises no indication regarding the dimensionality of the quantization. It therefore encompasses, inter alia, quantum wells, quantum wires and quantum dots and any combination of these structures.

A potential barrier for the holes, which impedes the penetration of holes into the n-conducting region, is preferably formed by means of the hole barrier layer 7. The probability of a nonradiative recombination of electrons and holes outside the active region in the n-conducting region can be reduced in this way. The internal quantum efficiency of the semiconductor chip can thereby be stabilized even at high current densities. If the hole barrier layer were dispensed with, the probability that holes passed to the active region via the p-conducting region would penetrate into the n-conducting region 4 would increase with increasing current density. The internal quantum efficiency would then be correspondingly reduced.

On account of the hole barrier layer 7 integrated in the semiconductor body 3, therefore, the potential barrier that is to be overcome by holes for entry into the n-conducting region 4 is preferably increased relative to a semiconductor body without a hole barrier layer.

The barrier height can be influenced by means of the band gap of the hole barrier layer 7 and/or by suitable doping of the hole barrier layer. The band gap, by way of example, can be set by means of the aluminum content x of the hole barrier layer, the band gap also increasing as the aluminum content increases. An aluminum content x of 0.2 or more is particularly suitable for a hole barrier layer 7.

In order to counteract tensile strains which arise on account of the decreasing lattice constant of the hole barrier layer as the aluminum content increases and which, particularly in the case of a hole barrier layer where y=0, would occur to an increased extent as the aluminum content increases, in the active region 6 based for example on $In_yGa_{1-y}N$ where $0<y\leq 1$, the indium content y of the hole barrier layer 7 is preferably chosen to be greater than 0. If the hole barrier layer 7 contains both indium and aluminum and, if appropriate, gallium, then y<x preferably holds true. For matching of the lattice constant or compensation of the strain induced by the aluminum, an indium proportion y which is less than the aluminum proportion x is particularly suitable, in particular for an active region based on $In_yGa_{1-y}N$. The hole barrier layer may accordingly simultaneously be embodied as a buffer layer for the active region 6 and as a barrier layer for holes. Furthermore, in particular for an indium-free hole barrier layer, the aluminum content is preferably less than or equal to 0.45. Strain can be kept small in this way.

Figure 2:
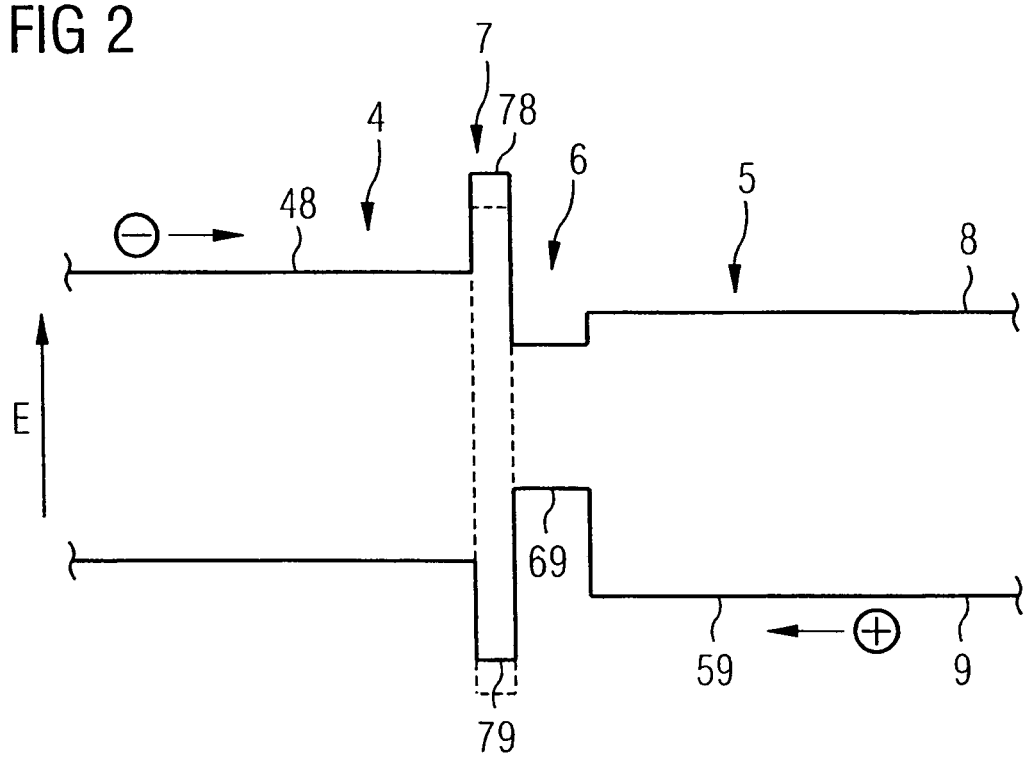
FIG. 2 schematically shows the profile of the valence and conduction band edge for a tunnel barrier layer.

In a preferred configuration, the hole barrier layer 7 is embodied as a tunnel barrier layer. One example of a band diagram for a tunnel barrier layer is illustrated schematically in FIG. 2. FIG. 2 schematically shows the profile of the conduction band edge 8 and the valence band edge 9 in the semiconductor body 3 of the semiconductor chip, which is preferably operated in the forward direction.

In energetic terms, the conduction band edge 78 of the hole barrier layer 7 formed as a tunnel barrier layer lies above the conduction band edge 48 of the layer adjoining the hole barrier layer 7 in the n-conducting region 4. In energetic terms, the valence band edge 79 of the tunnel barrier layer lies below the valence band edge 69 of the active region and preferably below the valence band edge 59 of the layer adjoining the active region 6 on the part of the p-conducting region 5. Electrons which are passed to the active region 6 from the n-conducting region 4 have to overcome a potential barrier in the same way as holes for penetration into the n-conducting region. The height of the potential barrier to be overcome for electrons is given by the difference between the energies of the conduction band edge 78 and the conduction band edge 48, and the height of the potential barrier for the holes is given by the difference between the energies of the valence band edge 69 and the valence band edge 79.

The tunneling probability with which the charge carriers tunnel through the tunnel barrier layer depends on the respective barrier height to be overcome and the thickness of the tunnel barrier layer. To an approximation (to a WKB approximation), the tunneling probability T is proportional to $$T \propto \exp\left(-\frac{2d}{\hbar} \cdot \sqrt{2m \cdot (V_0 - E)}\right)$$

with the absolute barrier height $V_0$, the barrier thickness d, and the energy E of the charge carriers and the effective mass m of the respective charge carriers. The barrier height to be overcome by the charge carriers is determined by the difference between the absolute barrier height $V_0$—the energy of the conduction or valence band edge of the tunnel barrier layer—and the energy E of the respective charge carriers. The barrier height can be set by way of the band gap, i.e., the difference between the energies of the valence band edge and the conduction band edge of the hole barrier layer 7. As already explained above, this may be done by means of the aluminum content x.

Figure 3:
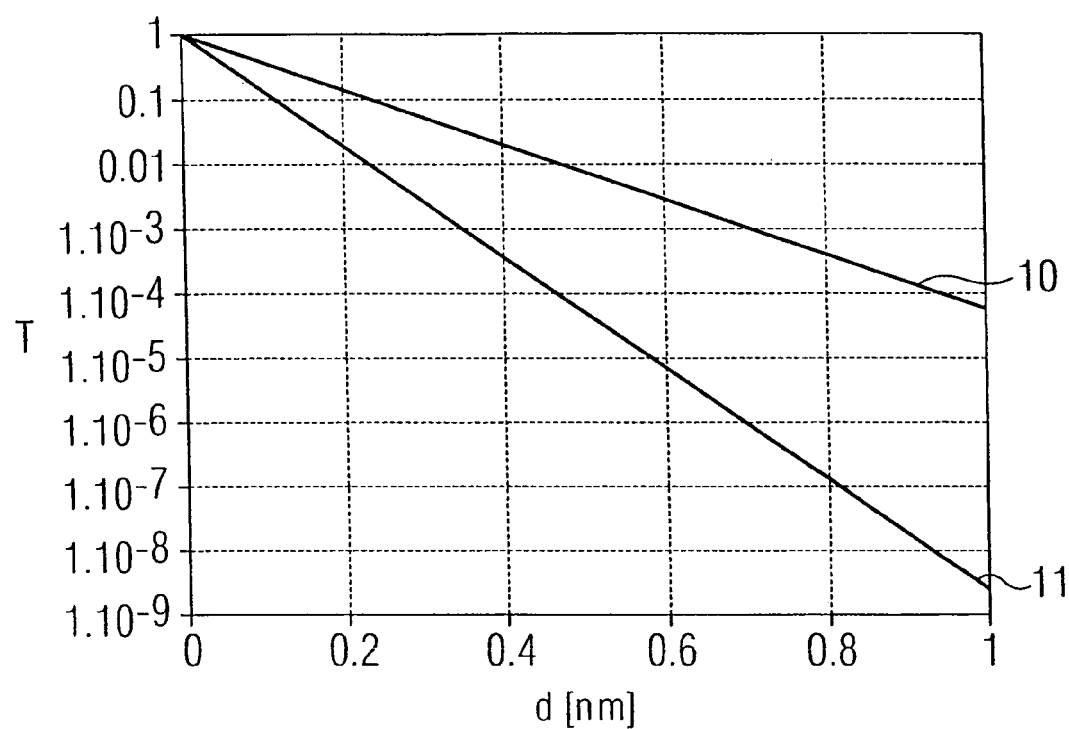
FIG. 3 shows a diagram depicting the tunneling probabilities for electrons and holes.

FIG. 3 illustrates the tunneling probability 10 for electrons and the tunneling probability 11 for holes as a function of the thickness d of the tunnel barrier layer in nanometers for an $Al_{0.5}Ga_{0.5}N$ tunnel barrier layer in one diagram. The tunneling probabilities were determined on the basis of the relationship specified above. Since the effective mass of the holes is greater than that of the electrons, the tunneling probability 11, as the thickness of the tunnel barrier layer increases, decreases to a significantly greater extent than that of the electrons. The effective mass of the holes amounts to approximately ten times or more the effective mass of the electrons. This results in different tunneling probabilities for electrons and for holes, so that, by means of charge carrier asymmetric tunneling, a much greater proportion of electrons than holes can tunnel through the tunnel barrier layer. Holes are mostly kept at the active region 6 by means of the tunnel barrier layer.

The tunneling probability of the electrons through the tunnel barrier layer may amount to ten times or more, preferably a hundred times or more, particularly preferably a thousand times or more, the tunneling probability of the holes through the tunnel barrier layer. This may be achieved by forming the tunnel barrier layer in a suitable manner.

The thickness of the tunnel barrier layer is preferably 8 nm or less, particularly preferably 4 nm or less. A thickness of greater than or equal to 1 nm has been found to be particularly advantageous. Particularly suitable values for the aluminum content x are between 0.2 and 0.45 inclusive in each case, preferably greater than or equal to 0.3. Tunnel barrier layers with an aluminum content of this type are particularly suitable in particular with regard to a moderate lattice mismatch.

The ratio of the tunneling probability of the electrons to that of the holes may, if appropriate, additionally be increased in a targeted manner. For this purpose, the tunnel barrier layer may be doped in n-conducting fashion, by way of example. The conduction band edge 78 of the tunnel barrier layer is then lowered, in the same way as the valence band edge 79 of the tunnel barrier layer. The band gap remains essentially constant, so that the barrier height for holes is increased, while the barrier height for electrons is reduced. A dopant having comparatively deep donor levels, for example Si, is particularly suitable for this purpose.

As an alternative or in addition, it is possible to incorporate defects into the tunnel barrier layer in a targeted manner, which assist the tunneling of the electrons relative to the hole tunneling (trap assisted tunneling) and accordingly increase the tunneling probability for electrons relative to that of the holes. Si, for example, is suitable as a defect atom.

A targeted lowering of the potential barrier for the electrons is indicated by dashed lines in FIG. 2. The dependence of the internal quantum efficiency on the current density can advantageously be reduced by means of the tunnel barrier layer since the holes, even at high current densities, recombine radiatively in the active region 6 to an increased extent and the penetration of holes into the n-conducting region is effectively blocked by means of the tunnel barrier layer.

Figure 4:
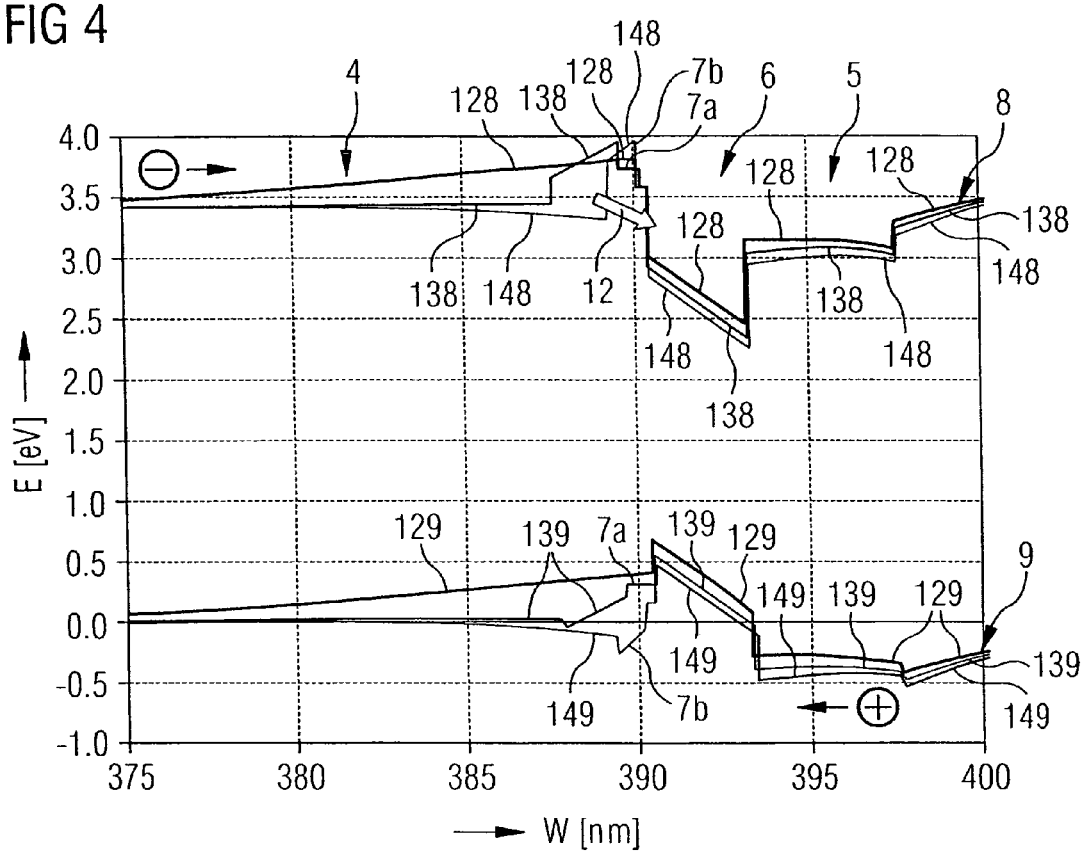
FIG. 4 shows results of a simulation calculation for the profile of the conduction and valence band edge for differently formed hole barrier layers.

In FIG. 4, band diagrams obtained from a simulation calculation illustrate the influence of the aluminum content on the barrier height of an $Al_xGa_{1-x}N$ tunnel barrier layer where x>0. The valence and conduction band edges in a semiconductor body similar to that shown in FIG. 1 are plotted for hole barrier layers with different aluminum contents. The W direction indicates the growth direction of the semiconductor body, in which the individual layers for the semiconductor body were grown successively, e.g. epitaxially on an epitaxial substrate.

The conduction band edge 128 and the valence band edge 129 correspond to a nitride-compound-semiconductor-based semiconductor body without an aluminum-containing tunnel barrier layer. The semiconductor chip with the semiconductor body was assumed to be operated in forward direction at 3.4 volts.

A tunnel barrier layer 7a where x=0.15 is provided in the case of the conduction band edge 138 and the valence band edge 139. For the conduction band edge 148 and the valence band edge 149, the tunnel barrier layer 7b has an aluminum content of 0.3. The barrier height of the potential barrier of the tunnel barrier layer increases for electrons and also for holes with the band gap of the tunnel barrier layer that increases on account of the increasing aluminum content. The arrow 12 symbolizes tunneling of the electrons into the active region.

In a further preferred configuration, the hole barrier layer 7 is embodied as a pure hole barrier layer. In the case of a pure hole barrier layer, in contrast to a tunnel barrier layer, electrons pass into the active region 6 from the n-conducting region 4 essentially unimpeded, i.e. in a manner free of a potential barrier.

FIG. 5 schematically shows a band diagram for a pure hole barrier layer. FIG. 5 essentially corresponds to the diagram shown in FIG. 2. In contrast thereto, the hole barrier layer 7 has a conduction band edge 78 whose energy is less than or equal to that of the conduction band edge 48 of a layer adjoining the pure hole barrier layer 7 on the part of the n-conducting region 4. The valence band edge 79 of the pure hole barrier layer is situated at a deeper level in energetic terms than the valence band edge 69 of the adjoining layer on the part of the active region and preferably at a deeper level in energetic terms than the valence band edge 59 of a layer adjoining the active region 6 on the part of the p-conducting region 5. Electrons in the semiconductor body can thus enter into the active region 6 from the n-conducting region 4 essentially in a manner free of a potential barrier, while the potential barrier has to be overcome by the holes in order to pass into the n-conducting region 4. In contrast to a tunnel barrier layer, the pure hole barrier layer may be made comparatively thick since tunneling-through of electrons does not have to be taken into account. The probability of passage of holes into the n-conducting region can be kept extremely low in this way, for example less than or equal to $10^{-4}$ or less than or equal to $10^{-5}$. By way of example, the pure hole barrier layer has an aluminum content of between 0.2 and 0.3 inclusive in each case. A thickness of the pure hole barrier layer may be between 11 nm and 30 nm inclusive in each case. If appropriate, the pure hole barrier layer may also be made thicker. Furthermore, the pure hole barrier layer is preferably doped more heavily ($n^+$) than a layer which is arranged on the part of the n-conducting region and, in particular, adjoins the hole barrier layer. The formation of a junction to the active region which is barrier-free for electrons can be facilitated in this way. Furthermore, the conduction band edge 78 of the hole barrier layer may also lie below the conduction band edge 48 in energetic terms. This is indicated by dashed lines in FIG. 5.

Overall, the dependence of the internal quantum efficiency of the semiconductor chip 1 on the current density can be reduced in a simplified manner with the hole barrier layers described above—a pure hole barrier layer or a tunnel barrier layer.

This is illustrated by the diagram in FIG. 6, which shows the results of a simulation. FIG. 6 shows the dependence of the internal quantum efficiency Q in percent of the semiconductor chip 1 on the operating current density j in amperes per square centimeter. The current density j is plotted in logarithmic scale. The curve 14 was determined for a semiconductor chip with a semiconductor body based on a nitride compound semiconductor without an aluminum-containing hole barrier layer, and the curve 13 was determined for a corresponding semiconductor body with an aluminum-containing hole barrier layer. The dependence of the internal quantum efficiency Q on the current density j is greatly reduced in the case of the curve 13 relative to the curve 14. For the semiconductor chip with the hole barrier layer, the internal quantum efficiency is essentially constant and independent of the operating current density.

FIG. 7 shows a schematic sectional view of a second exemplary embodiment of a semiconductor chip 1 according to the invention.

The semiconductor chip 1 essentially corresponds to the semiconductor chip described in connection with FIG. 1. In contrast thereto, the semiconductor chip 1 shown in FIG. 7 is embodied as a thin-film chip. Accordingly, the carrier 2 is different from an epitaxial substrate on which a semiconductor layer sequence for the semiconductor body 3 is grown epitaxially. The semiconductor body 3 may be produced on the epitaxial substrate and subsequently be arranged and preferably fixed on the carrier 2 by its side remote from the epitaxial substrate. Advantageously, the carrier 2 does not have to satisfy the stringent requirements made of an epitaxial substrate. The epitaxial substrate may subsequently be removed, so that the thin-film chip is free of an epitaxial substrate. By way of example, etching, water jet cutting or a laser separating method is suitable for this purpose. For a semiconductor body based on a nitride compound semiconductor, SiC or sapphire is suitable as material for the epitaxial substrate, for example. If appropriate, the carrier may also contain materials of this type. As an alternative, the carrier may be metallic or embodied as ceramic. This enables the electrical conductivity or the thermal conductivity to be further improved relative to an epitaxial substrate.

A metallic mirror layer 15 is preferably arranged between the carrier 2 and the semiconductor body 3. Said mirror layer may prevent absorption of radiation generated in the active region 6 in a possibly absorbent carrier by means of reflection of the radiation at the mirror layer. Furthermore, the proportion of radiation emerging from the semiconductor body 3 via the main area 16 remote from the carrier can be increased on account of the mirror layer. A connecting layer 17, by means of which the semiconductor body 3 is fixed on the carrier 2, is preferably arranged between the mirror layer 15 and the carrier 2. The connecting layer 17 may be embodied for example as a solder layer or a layer formed in a wafer bonding method. The connecting layer 17, the mirror layer 15 and/or the carrier 2 is preferably embodied in electrically conductive fashion. The connecting layer 17, the mirror layer 15 and/or the carrier 2 is particularly preferably electrically conductively connected to the active region 6. The active region 6 can thus be electrically conductively connected by means of a contact layer (not illustrated) arranged on that side of the carrier which is remote from the semiconductor body. A corresponding counter-contact layer (not illustrated) may be arranged on the main area 16. Said contact layer(s) is(are) preferably embodied in metallic fashion.

For an active region based on nitride compound semiconductors that are particularly suitable for generating radiation from the ultraviolet to the green spectral range, the mirror layer 15 preferably contains Al, Ag, Pt or an alloy with at least one of said materials. Said materials may have advantageously high reflectivities in the aforementioned spectral ranges.

In the case of the thin-film chip, the hole barrier layer 7 is arranged on that side of the active region 6 which is remote from the carrier 2 since the semiconductor body was arranged with the p-conducting region 5 on the carrier 2 after conclusion of the growth. The hole barrier layer may be formed according to the explanations above, in which case, the efficiency, in particular the coupling-out efficiency, of the semiconductor chip can advantageously be increased on account of the mirror layer and the comparatively free choice of carrier.

The scope of protection of the invention is not limited to the examples given hereinabove. The invention is embodied in each novel characteristic and each combination of characteristics, which particularly includes every combination of any features which are stated in the claims, even if this feature or this combination of features is not explicitly stated in the claims or in the examples.

In particular a hole barrier layer according to the invention can be used not only in the case of LED chips but also in the case of laser chips with an optical resonator, such as an edge-emitting laser chip, a VCSEL (Vertical Cavity Surface Emitting Laser) with an internal resonator, a VECSEL (Vertical External Cavity Surface Emitting Laser) with an external resonator or an RCLED (Resonant Cavity Light Emitting Diode).

We claim:

1. A radiation-emitting semiconductor chip having a semiconductor body, wherein the semiconductor body comprises:
an n-conducting region;
a p-conducting region;
an active region configured to generate radiation and being arranged between the n-conducting region and the p-conducting region, electrons which are passed into the active region via the n-conducting region and holes which are passed into the active region via the p-conducting region being recombined in the active region with the generated radiation; and
a hole barrier layer arranged on an opposite side of the active region from the p-conducting region, said hole barrier layer containing a material from the III-V semiconductor material system $In_yGa_{1-x-y}Al_xN$, where $0 \leq x \leq 1$, $y > 0$, $x+y \leq 1$, and $y < x$, the hole barrier layer being transmissive for the electrons.

2. The semiconductor chip as claimed in claim 1, wherein the hole barrier layer is arranged between the n-conducting region and the active region or the hole barrier layer is integrated in the n-conducting region on a side of the n-conducting region that faces the active region.

3. The semiconductor chip as claimed in claim 1, wherein the hole barrier layer adjoins the active region or the hole barrier layer delimits the active region.

4. The semiconductor chip as claimed in claim 1, wherein $x > 0$.

5. The semiconductor chip as claimed in claim 4, wherein $x \geq 0.2$.

6. The semiconductor chip as claimed in claim 4, wherein $x \leq 0.45$.

7. The semiconductor chip as claimed in claim 1, wherein y=0.

8. The semiconductor chip as claimed in claim 1, wherein the hole barrier layer is formed as a buffer layer, in particular for the active region.

9. The semiconductor chip as claimed in claim 1, wherein the active region is based on the material system $In_yGa_{1-y}N$ where $0<y\leq1$.

10. The semiconductor chip as claimed in claim 1, wherein the hole barrier layer comprises a tunnel barrier layer which is configured such that electrons have a higher probability of tunneling through the tunnel barrier layer then holes.

11. The semiconductor chip as claimed in claim 10, wherein the tunnel barrier layer is doped in an n-conducting manner or is embodied intrinsically.

12. The semiconductor chip as claimed in claim 1, wherein the hole barrier layer comprises a pure hole barrier layer which blocks holes from passing through.

13. The semiconductor chip as claimed in claim 12, wherein the pure hole barrier layer completely blocks holes from passing through.

14. The semiconductor chip as claimed in claim 1, wherein the semiconductor chip comprises a thin-film chip.

15. The semiconductor chip as claimed in claim 1, wherein the semiconductor body is arranged on a carrier.

16. The semiconductor chip as claimed in claim 15, further comprising a mirror layer is arranged between the active region and the carrier.

17. The semiconductor chip as claimed in claim 16, wherein said mirror layer is metallic.

18. A radiation-emitting semiconductor chip having a semiconductor body, wherein the semiconductor body comprises:
    an n-conducting region;
    a p-conducting region;
    an active region configured to generate radiation and being arranged between the n-conducting region and the p-conducting region, electrons which are passed into the active region via the n-conducting region and holes which are passed into the active region via the p-conducting region being recombined in the active region with the generated radiation; and
    a hole barrier layer arranged on an opposite side of the active region from the p-conducting region, said hole barrier layer containing a material from the III-V semiconductor material system $In_yGa_{1-x-y}Al_xN$ where $0\leq x\leq1$, $0\leq y\leq1$, and $x+y\leq1$, the hole barrier layer being transmissive for the electrons;
    wherein the hole barrier layer comprises a tunnel barrier layer which is configured such that electrons have a higher probability of tunneling through the tunnel barrier layer than holes, and wherein the tunnel barrier layer is doped in an n-conducting manner or is embodied intrinsically.

19. The semiconductor chip as claimed in claim 18, wherein the tunnel barrier layer has a thickness of 8 nm or less.

20. The semiconductor chip as claimed in claim 18, wherein the tunnel barrier layer has a thickness of 4 nm or less.

21. The semiconductor chip as claimed in claim 18, wherein the semiconductor chip comprises a thin-film chip.

22. The semiconductor chip as claimed in claim 18, wherein the semiconductor body is arranged on a carrier.

23. The semiconductor chip as claimed in claim 22, further comprising a mirror layer arranged between the active region and the carrier.

24. The semiconductor chip as claimed in claim 23, wherein said mirror layer is metallic.

25. A radiation-emitting semiconductor chip having a semiconductor body, wherein the semiconductor body comprises:
    an n-conducting region;
    a p-conducting region;
    an active region configured to generate radiation and being arranged between the n-conducting region and the p-conducting region, electrons which are passed into the active region via the n-conducting region and holes which are passed into the active region via the p-conducting region being recombined in the active region with the generated radiation; and
    a pure hole barrier layer arranged on an opposite side of the active region from the p-conducting region, said pure hole barrier layer blocking holes from passing through and containing a material from the III-V semiconductor material system $In_yGa_{1-x-y}Al_xN$, where $0\leq x\leq1$, $0\leq y\leq1$, and $x+y\leq1$, the pure hole barrier layer being transmissive for the electrons.

26. The semiconductor chip as claimed in claim 25, wherein the pure hole barrier layer is completely transmissive for the electrons.

27. The semiconductor chip as claimed in claim 25, wherein the pure hole barrier layer is doped in an n-conducting manner such that energy of a conduction band edge of the hole barrier layer is less than or equal to the energy of the conduction band edge of a layer adjoining the hole barrier layer on a side of the hole barrier layer which is opposite to the active region.

28. The semiconductor chip as claimed in claim 25, wherein the pure hole barrier layer has a thickness of 11 nm or more.

29. The semiconductor chip as claimed in claim 25, wherein the semiconductor chip comprises a thin-film chip.

30. The semiconductor chip as claimed in claim 25, wherein the semiconductor body is arranged on a carrier.

31. The semiconductor chip as claimed in claim 30, further comprising a mirror layer arranged between the active region and the carrier.

32. The semiconductor chip as claimed in claim 31, wherein said mirror layer is metallic.

* * * * *

UNITED STATES PATENT AND TRADEMARK OFFICE
CERTIFICATE OF CORRECTION

PATENT NO.         : 7,791,081 B2                                                           Page 1 of 1
APPLICATION NO.    : 11/494984
DATED              : September 7, 2010
INVENTOR(S)        : Matthias Peter et al.

It is certified that error appears in the above-identified patent and that said Letters Patent is hereby corrected as shown below:

On the Title Page

Item --(75) Inventors should read,    Matthias Peter, Alteglofsheim (DE);
        Uwe "Strausse" Strauss, Bad Abbach (DE);
        Matthias Sabathil, Regensburg (DE)--

Col. 13, lines 9-12, should read,

--10. The semiconductor chip as claimed in claim 1, wherein the hole barrier layer comprises a tunnel barrier layer which is configured such that electrons have a higher probability of tunneling through the tunnel barrier layer "then" than holes.--

Signed and Sealed this
Twentieth Day of March, 2012

David J. Kappos
*Director of the United States Patent and Trademark Office*